United States Patent
Tracy et al.

(10) Patent No.: US 7,566,238 B2
(45) Date of Patent: Jul. 28, 2009

(54) CARD CONNECTOR DAMPENING ASSEMBLY

(75) Inventors: Mark S. Tracy, Houston, TX (US); Earl W. Moore, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/490,928

(22) Filed: Jul. 21, 2006

(65) Prior Publication Data

US 2008/0020625 A1 Jan. 24, 2008

(51) Int. Cl.
*H01R 13/648* (2006.01)

(52) U.S. Cl. .............................. 439/382; 439/384; 439/2

(58) Field of Classification Search ................. 439/382, 439/2, 384, 630
See application file for complete search history.

(56) References Cited

U.S. PATENT DOCUMENTS

| | | | | |
|---|---|---|---|---|
| 5,161,981 A * | 11/1992 | Deak et al. | ..................... | 439/66 |
| 5,317,308 A | 5/1994 | Tribbey et al. | | |
| 5,426,568 A * | 6/1995 | Lamers et al. | ............... | 361/810 |
| 5,757,580 A * | 5/1998 | Andress et al. | ........... | 360/97.02 |
| 5,833,471 A * | 11/1998 | Selna | ........................... | 439/73 |
| 5,914,864 A | 6/1999 | MacDonald, Jr. et al. | | |
| 5,958,556 A * | 9/1999 | McCutcheon | ............... | 428/172 |
| 6,735,043 B2 * | 5/2004 | Bernett et al. | ............. | 360/97.01 |
| 2003/0017726 A1 * | 1/2003 | Pupkiewicz et al. | ........... | 439/66 |
| 2004/0084208 A1 * | 5/2004 | Ives et al. | .................... | 174/260 |
| 2006/0221588 A1 * | 10/2006 | Summers et al. | ............ | 361/796 |

FOREIGN PATENT DOCUMENTS

| | | |
|---|---|---|
| EP | 1073150 | 1/2001 |
| EP | 1587349 | 10/2005 |
| JP | 2002 124328 | 4/2002 |

OTHER PUBLICATIONS

Thomas & Betts catalog, Elastomeric Connectors, 1998.*
Foreign Search Report dated Jan. 11, 2008.

* cited by examiner

*Primary Examiner*—Edwin A. Leon
*Assistant Examiner*—Vanessa Girardi

(57) ABSTRACT

A card connector dampening assembly comprises a connector coupled to a printed circuit board and configured to receive an electronic card connected therewith and a dampening member disposed at least partially between the printed circuit board and the electronic card.

19 Claims, 3 Drawing Sheets

CARD CONNECTOR DAMPENING ASSEMBLY

BACKGROUND OF THE INVENTION

Printed circuit board assemblies often comprise a primary circuit board (e.g., a motherboard) having various components fixedly coupled or connected thereto (e.g., soldered to the motherboard) and other components that are removably coupled or connected thereto using a connector or socket. For example, single in-line memory modules (SIMMs), dual in-line memory modules (DIMMs), peripheral component interconnect express (PCIe) mini-cards, and other types of electronic cards generally comprise a connector edge having conductive leads or contacts that mate with and/or otherwise engage a socket or connector that is conductively coupled to the motherboard. However, vibration and/or other types of movement causes wear of the edge connector contacts, especially if the electronic device containing the motherboard/electronic card is disposed in a mobile device (e.g., a notebook computer or hand-held gaming device), thereby resulting in fretting corrosion (e.g., when a protective oxide layer on the edge connector contacts wears away) which degrades the quality of electrical contact between the electronic card and the connector/motherboard.

DETAILED DESCRIPTION OF THE DRAWINGS

The preferred embodiments of the present invention and the advantages thereof are best understood by referring to FIGS. 1-4 of the drawings, like numerals being used for like and corresponding parts of the various drawings.

Figure 1:
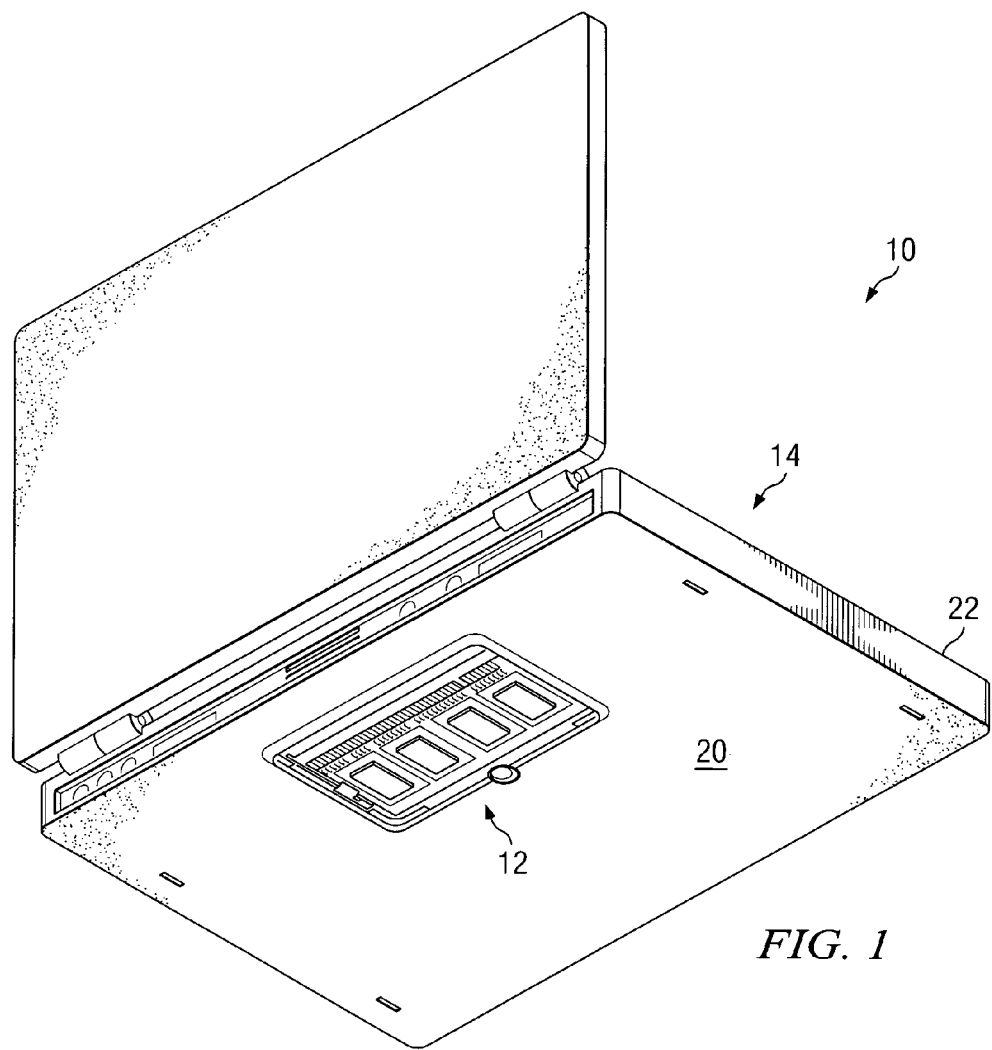
FIG. 1 is a diagram illustrating an electronic device in which an embodiment of a card connector dampening assembly in accordance with the present invention is employed to advantage.

FIG. 1 is a diagram illustrating an electronic device 10 in which an embodiment of a card connector dampening assembly 12 is employed to advantage. In the embodiment illustrated in FIG. 1, electronic device 10 comprises a notebook computer 14. However, it should be understood that embodiments of assembly 12 in accordance with the present invention may be employed to advantage in a variety of different types of electronic devices 10 such as, but not limited to, a cellular phone, tablet computer, convertible portable computer, gaming device, or any other type of portable or non-portable device where vibration or other types of motion are a concern. In the embodiment illustrated in FIG. 1, an access panel has been removed from a bottom surface 20 of a base member 22 of computer 14 to illustrate an exemplary location of where assembly 12 may be used. However, it should be understood that assembly 12 may be used at any location with respect to electronic device 10.

Figure 2:
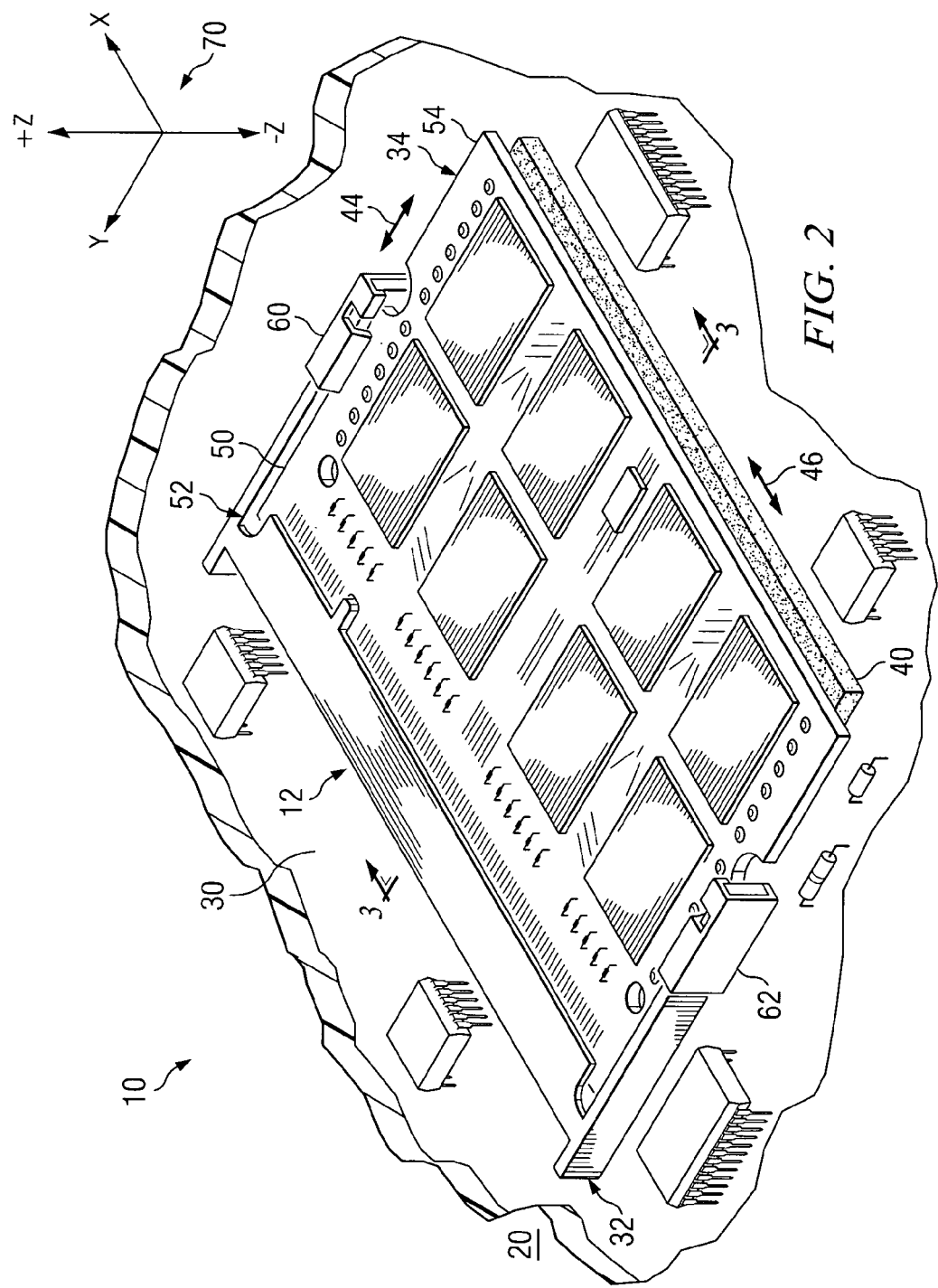
FIG. 2 is a diagram illustrating an enlarged view of the card connector dampening assembly illustrated in FIG. 1.

FIG. 2 is a diagram illustrating an enlarged view of card connector dampening assembly 12 illustrated in FIG. 1. In the embodiment illustrated in FIG. 2, assembly 12 comprises a printed circuit board 30 having a socket or connector 32 coupled thereto. Printed circuit board 30 may comprise a motherboard or any other type of electronic circuit board disposed within device 10. In the embodiment illustrated in FIG. 2, assembly 12 also comprises an electronic card 34 connectable and/or otherwise couplable to connector 32 to facilitate communicative coupling of electronic card 34 to printed circuit board 30. Electronic card 34 may comprise any type of electronic card (e.g., another printed circuit board) such as, but not limited to, a single in-line memory module (SIMM), a dual in-line memory module (DIMM), a peripheral component interconnect express (PCIe) mini-card, a video card, a graphics card, or a wireless communications card. In the embodiment illustrated in FIG. 2, connector 32 comprises a ninety degree connector 32 to enable electronic card 34 to be positioned and/or oriented parallel to a plane of printed circuit board 30 (as used herein, parallel shall mean parallel or substantially parallel), thereby accommodating limited space availability within electronic device 10.

In the embodiment illustrated in FIG. 2, assembly 12 also comprises a dampening member 40 disposed between electronic card 34 and printed circuit board 30. In FIG. 2, dampening member 40 is disposed between electronic card 34 and printed circuit board 30 in a parallel orientation with electronic card 34 and printed circuit board 30 to substantially prevent or eliminate detrimental affects that may result from vibration or motion of electronic device 10 (e.g., to dampen or prevent vibratory movement). Preferably, dampening member 40 is sized having a length and width in the directions indicated by arrows 44 and 46, respectively, corresponding substantially to a length and width of electronic card 34. However, it should be understood that the sizing of dampening member 40 may be otherwise configured. Further, in the embodiment illustrated in FIG. 2, a single dampening member 40 is illustrated as being disposed between electronic card 34 and printed circuit board 30. However, it should be understood that dampening member 40 may comprise a plurality of discrete and/or separate units disposed between electronic card 34 and printed circuit board 30 (in sufficient number depending on a size of electronic card 34) in a spaced apart relationship relative to each other, abutting each other, or otherwise positioned.

Preferably, dampening member 40 is formed from a compressible material to facilitate dampening member 40 being slightly compressed in response to installation of electronic card 34 in connector 32. For example, in some embodiments of the present invention, dampening member 40 is configured from a foam-based material such as a ⅛-inch thick sheet of foam available from E-A-R Specialty Composites (i.e., the Arrow Corporation of Indianapolis, Ind.) as part number CF-47012EG. However, it should be understood that other types of compressible materials may be used to form dampening member 40.

In operation, printed circuit board 30 is preferably manufactured and/or otherwise provided with connector 32 coupled thereto for receiving electronic card 34 connected therewith. Electronic card 34 is inserted and/or otherwise disposed in connector 32 (e.g., inserted into connector 32 at an approximately thirty degree angle) to engage an end 50 of electronic card 34 with a portion 52 of connector 32. An end 54 of electronic card 34 is then moved downwardly toward printed circuit board 30 until electronic card 34 is disposed in a position parallel with printed circuit board 30 and/or until electronic card 34 is in a position to be secured relative to connector 32 using connector clips 60 and 62. In response to locating electronic card 34 in connector 32, a compressive force is applied by electronic card 34 to dampening member 40, thereby resulting in a slight compression of dampening member 40 which thereby substantially prevents or eliminates movement of electronic card 34 relative to printed circuit board 30. For example, installation of electronic card 34 within connector 32 substantially prevents movement of electronic card 34 relative to printed circuit board 30 in the X, Y and +Z directions as indicated by the reference axis 70 illustrated in FIG. 2. Dampening member 40 substantially prevents or eliminates movement of electronic card 34 in a −Z direction as indicated by reference axis 70 relative to printed circuit board 70. Dampening member 40 may be located on printed circuit board 30 before insertion of electronic card 34 into connector 32, inserted between electronic card 34 and printed circuit board 30 after electronic card 34 is inserted into connector 32 and/or clipped in place (e.g., using clips 60 and 62), or dampening member 40 may be attached to, adhered to or otherwise form part of either printed circuit board 30 or electronic card 34.

Figure 3:
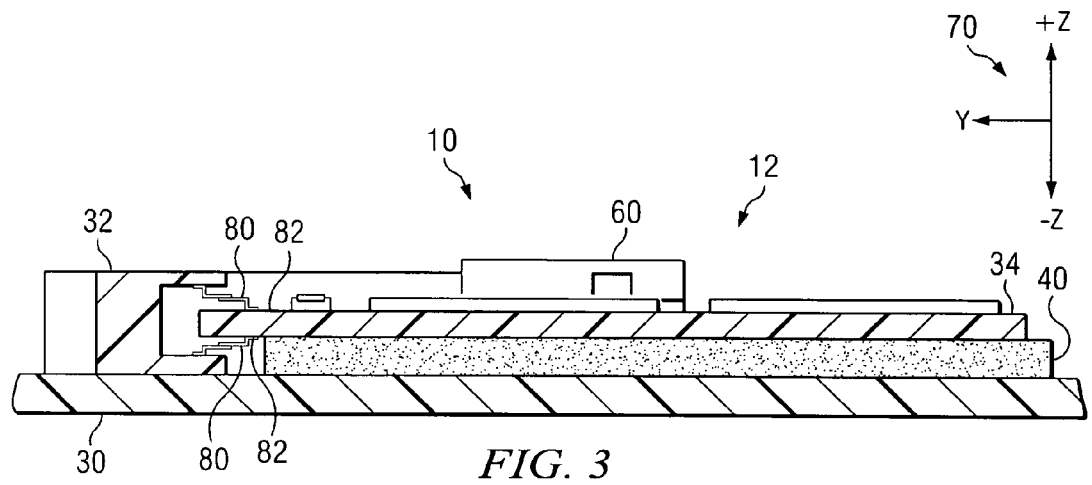
FIG. 3 is a diagram illustrating a sectional view of the card connector dampening assembly of FIG. 2 taken along the line 3-3 of FIG. 2.

FIG. 3 is a diagram illustrating a sectional view of assembly 12 illustrated in FIG. 2, taken along the line 3-3 of FIG. 2. As illustrated in FIG. 3, dampening member 40 is disposed at least partially between electronic card 34 and printed circuit board 30 to substantially prevent or eliminate movement of electronic card 34 in the −Z direction relative to printed circuit board 30 as indicated by reference axis 70. Thus, embodiments of the present invention substantially prevent or eliminate wear and/or fretting corrosion between contacts 80 of connector 32 and corresponding and/or mating edge connector traces 82 of electronic card 34 in engagement therewith. For example, without dampening member 40, vibrations and/or movement of electronic device 10 may otherwise cause movement of electronic card 34 in the −Z direction relative to printed circuit board 30 which may cause wear and/or fretting corrosion between edge connector traces 82 and contacts 80, thereby detrimentally affecting the electrical conductivity between electronic card 34 and connector 32/printed circuit board 30. Accordingly, dampening member 40 substantially prevents or eliminates movement of electronic card 34 in the −Z direction relative to printed circuit board 30, thereby substantially preventing or eliminating wear and/or fretting corrosion between edge connector traces 82 and contact 80.

Figure 4:
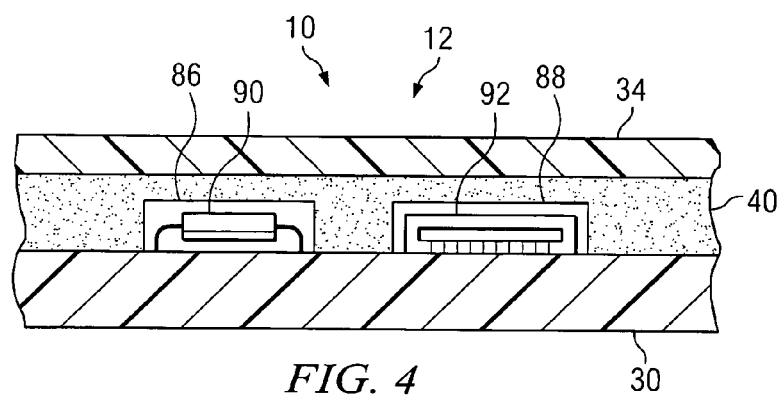
FIG. 4 is a diagram illustrating a sectional view of another embodiment of a card connector dampening assembly in accordance with the present invention.

FIG. 4 is a diagram illustrating another embodiment of assembly 12 in accordance with the present invention. In the embodiment illustrated in FIG. 4, dampening member 40 is configured having relief cavities 86 and 88. In FIG. 4, two relief cavities 86 and 88 are illustrated as being formed in dampening member 40. However, it should be understood that a greater or fewer quantity of relief cavities may be provide in dampening member 40. Relief cavities 86 and 88 are preferably configured as cavity portions disposed and/or otherwise formed within dampening member 40 at selected and/or particular locations corresponding to components of printed circuit board 30 (e.g., components 90 and 92 of printed circuit board 30) to prevent a compressive force from being applied to components 90 and 92 in response to installation of electronic card 34 in connector 32 (FIG. 3). In FIG. 4, relief cavities 86 and 88 are illustrated as being located to accommodate locations of components 90 and 92 of printed circuit board 30. However, it should be understood that, additionally or alternatively, relief cavities may be provided for components of electronic card 34.

It should be understood that dampening member 40 may be disposed between electronic card 34 and printed circuit board 30 in a variety of manners to secure dampening member 40 in a relatively fixed position between electronic card 34 and printed circuit board 30. For example, preferably, the compressive force applied by electronic card 34 to dampening member 40 is sufficient to retain dampening member 40 in a fixed position between electronic card 34 and printed circuit board 30. However, in some embodiments of the present invention, dampening member 40 may be secured to electronic card 34 or printed circuit board 30 by adhering and/or otherwise adhesively securing dampening member 40 to electronic card 34 or printed circuit board 30. It should be understood that other types of devices or methods may also be used to secure dampening member 40 in a fixed position between electronic card 34 and printed circuit board 30.

Thus, embodiments of the present invention substantially reduce or eliminate movement of an electronic card relative to a printed circuit board and/or connector engaged therewith. Accordingly embodiments of the present invention substantially reduce or eliminate wear between the contacts of the connector and edge connector leads of the electronic card engaged therewith, thereby providing a more reliable conductive coupling of the electronic card to the connector and corresponding printed circuit board.

What is claimed is:

1. A card connector dampening assembly, comprising:
 a connector electrically coupled to a printed circuit board and configured to receive an end of an electronic card and communicatively couple the electronic card connected therewith with the printed circuit board; and
 a dampening member disposed at least partially between the printed circuit board and the electronic card, wherein installation of the electronic card into the connector maintains at least a portion of the dampening member in a compressed state, wherein the dampening member has a length and a width substantially corresponding to a length and a width of the electronic card.

2. The assembly of claim 1, wherein the dampening member comprises a foam-based dampening member.

3. The assembly of claim 1, wherein the dampening member comprises at least one relief cavity for a component of the printed circuit board.

4. The assembly of claim 1, wherein the dampening member is adhered to the printed circuit board.

5. A card connector dampening assembly, comprising:
 a connector electrically coupled to a printed circuit board and configured to receive an end of an electronic card and communicatively couple the electronic card connected therewith with the printed circuit board; and
 a dampening member disposed at least partially between the printed circuit board and the electronic card, wherein installation of the electronic card into the connector maintains at least a portion of the dampening member in a compressed state, wherein the connector comprises a ninety degree connector.

6. A card connector dampening assembly, comprising:
 a connector means electrically coupled to a printed circuit board means and configured to receive an end of a card means and communicatively couple the card means connected therewith with the printed circuit board means; and
 a means, disposed at least partially between the printed circuit board means and the card means, for dampening vibration between the card means and the printed circuit board means, wherein installation of the card means maintains at least a portion of the means for dampening vibration in a compressed state, wherein the connector means comprises a ninety decree connector means.

7. The assembly of claim 6, wherein the dampening means comprises at least one relief means for a component of the printed circuit board means.

8. The assembly of claim 6, wherein the card means is disposed in a parallel orientation relative to the printed circuit board means.

9. A method for manufacturing a card connector dampening assembly, comprising:
- providing a printed circuit board having an electronic card communicatively connected thereto via a connector;
- disposing a dampening member at least partially between the printed circuit board and the electronic card;
- providing the dampening member having at least one relief cavity for at least one component of the printed circuit board; and
- moving an end of the electronic card toward the printed circuit board to compress the dampening member such that at least a portion of the dampening member is maintained in a compressed state while the electronic card is connected to the printed circuit board.

10. The method of claim 9, further comprising disposing a foam-based dampening member between the printed circuit board and the electronic card.

11. The method of claim 9, further comprising adhering the dampening member to the printed circuit board.

12. The method of claim 9, further comprising providing a ninety degree connector on the printed circuit board for receiving the electronic card.

13. A portable electronic, device, comprising:
- a connector electrically coupled to a printed circuit board and configured to communicatively couple an electronic card connected therewith with the printed circuit board; and
- a dampening member disposed between the printed circuit board and the electronic card, the dampening member substantially preventing wear between electrical contacts of the connector and mating edge connector traces of the electronic card and substantially preventing movement of the electronic card relative to the printed circuit board, wherein the dampening member comprises a length and width substantially corresponding to a length and a width of the electronic card.

14. The device of claim 13, wherein the dampening member comprises at least one relief cavity corresponding to a location of a component extending from the printed circuit board.

15. The device of claim 13, wherein the dampening member comprises at least one relief cavity configured to substantially prevent a compressive force from being applied to a component extending from the printed circuit board.

16. A portable electronic device, comprising:
- a connector that electrically couples to a printed circuit board and receives an end of an electronic card to communicatively couple the electronic card with the printed circuit board; and
- a dampening member disposed on the printed circuit board and at least partially between the printed circuit board and the electronic card, an end of the electronic card being moved toward the dampening member to apply a compressive force to the dampening member to fixedly secure the dampening member between the printed circuit board and the electronic card, wherein the dampening member is adhered to the electronic card or to the printed circuit board.

17. The device of claim 16, wherein the dampening member comprises at least one relief cavity corresponding to a location of a component extending from the printed circuit board.

18. A card connector dampening assembly, comprising:
- a connector attached and electrically coupled to a printed circuit board to receive an end of an electronic card and communicatively couple the electronic card to the printed circuit board; and
- a dampening member disposed at least partially between and contacting both the printed circuit board and the electronic card, wherein installation of the electronic card into the connector maintains at least a portion of the dampening member in a compressed state, and wherein the dampening member comprises at least one relief cavity for a component of the printed circuit board.

19. A portable electronic device, comprising:
- a connector electrically attached to a printed circuit board and receiving an end of an electronic card to electrically couple the electronic card connected therewith to the printed circuit board; and
- a dampening member disposed at least partially between and contacting both the printed circuit board and the electronic card, the electronic card being moved while in the connector to apply a compressive force to the dampening member when the electronic card is installed in the connector, the dampening member comprising at least one relief cavity corresponding to a location of a component extending from the printed circuit board.

* * * * *

UNITED STATES PATENT AND TRADEMARK OFFICE
CERTIFICATE OF CORRECTION

PATENT NO. : 7,566,238 B2
APPLICATION NO. : 11/490928
DATED : July 28, 2009
INVENTOR(S) : S. Tracy Page 1 of 1

It is certified that error appears in the above-identified patent and that said Letters Patent is hereby corrected as shown below:

In column 4, line 64, delete "decree" and insert -- degree --, therefor.

In column 5, line 27, after "electronic" delete ",".

Signed and Sealed this

Seventeenth Day of November, 2009

David J. Kappos
*Director of the United States Patent and Trademark Office*